(12) United States Patent
Hsu et al.

(10) Patent No.: US 12,281,787 B2
(45) Date of Patent: Apr. 22, 2025

(54) ADAPTER WITH ILLUMINATED ICON

(71) Applicant: Chicony Power Technology Co., Ltd., New Taipei (TW)

(72) Inventors: Tsai-Liang Hsu, New Taipei (TW); Hung-Yueh Hsiao, New Taipei (TW); Hsuan-Wei Ho, New Taipei (TW)

(73) Assignee: Chicony Power Technology Co., Ltd., New Taipei (TW)

( * ) Notice: Subject to any disclaimer, the term of this patent is extended or adjusted under 35 U.S.C. 154(b) by 0 days.

(21) Appl. No.: 18/405,171

(22) Filed: Jan. 5, 2024

(65) Prior Publication Data
US 2025/0102137 A1    Mar. 27, 2025

(30) Foreign Application Priority Data
Sep. 27, 2023   (TW) .................................. 112137191

(51) Int. Cl.
*F21V 33/00*    (2006.01)
*F21V 8/00*    (2006.01)
(Continued)

(52) U.S. Cl.
CPC .......... *F21V 33/0004* (2013.01); *F21V 11/00* (2013.01); *F21V 23/007* (2013.01);
(Continued)

(58) Field of Classification Search
CPC .... F21V 33/0004; F21V 11/00; F21V 23/007; F21V 29/70; H05K 5/0217;
(Continued)

(56) References Cited

U.S. PATENT DOCUMENTS 4,908,637 A * 3/1990 Chung ................... G01D 15/00
                                            358/1.11
6,285,299 B1 * 9/2001 King-Debaun ....... G06F 3/0238
                                            341/23
(Continued)

FOREIGN PATENT DOCUMENTS

CN         101009435         8/2007
CN         101009462         8/2007
(Continued)

OTHER PUBLICATIONS

Maria Garcia; Adapter Device for a Traffic Light Optical Unit; ES-1134132-U english translation; (Year: 2014).*

*Primary Examiner* — Zheng Song
*Assistant Examiner* — Glenn D Zimmerman
(74) *Attorney, Agent, or Firm* — Andrew M. Calderon; Calderon Safran & Wright P.C.

(57) ABSTRACT

An adapter includes an enclosure, a circuit module, a shielding element, a control module, a backlight module, and a masking element. The circuit module and the control module are arranged in the accommodating slot of the enclosure. The shielding element covers the circuit module and the control module is connected to the circuit module. The backlight module is located outside the shielding element and is connected to the control module. The wiring terminal of the backlight module is connected to the control module. The light-emitting area of the backlight module and the masking element are corresponds to the transparent area of the side surface of the enclosure. The control module controls the backlight module to cause the light-emitting area to emit light to irradiate the masking element, so that part of the light penetrates the enclosure through the transparent area and forms an illuminated icon.

18 Claims, 14 Drawing Sheets

(51) Int. Cl.
    *F21V 11/00*     (2015.01)
    *F21V 23/00*     (2015.01)
    *F21V 29/70*     (2015.01)
    *F21Y 103/10*     (2016.01)
    *G09F 13/18*     (2006.01)
    *H05K 5/02*     (2006.01)

(52) U.S. Cl.
    CPC .............. *F21V 29/70* (2015.01); *G02B 6/006* (2013.01); *G09F 13/18* (2013.01); *H05K 5/0217* (2013.01); *F21Y 2103/10* (2016.08); *H01H 2219/044* (2013.01)

(58) Field of Classification Search
    CPC .......... F21Y 2103/10; H01H 2219/044; G02B 6/006; G09F 13/18

See application file for complete search history.

(56) References Cited

U.S. PATENT DOCUMENTS

| | | | | |
|---|---|---|---|---|
| 2004/0053533 A1* | 3/2004 | Huang | ................. | H01R 13/465 |
| | | | | 439/606 |
| 2010/0238667 A1* | 9/2010 | Wu | ........................ | G02B 6/006 |
| | | | | 362/310 |
| 2019/0134478 A1* | 5/2019 | Topolosky | ............. | A63B 63/08 |

FOREIGN PATENT DOCUMENTS

| | | | |
|---|---|---|---|
| CN | 101447686 | | 12/2010 |
| CN | 101840659 | | 7/2012 |
| CN | 206541571 | | 10/2017 |
| CN | 211456737 | | 9/2020 |
| CN | 112333406 A | * | 2/2021 |
| CN | 219533842 U | * | 8/2023 |
| ES | 1134132 U | * | 11/2014 |
| TW | M329231 | | 3/2008 |
| TW | I310625 | | 6/2009 |
| TW | M383186 | | 6/2010 |
| TW | 201035924 | | 10/2010 |
| TW | M389917 | | 10/2010 |
| TW | I759242 | | 3/2023 |

\* cited by examiner

ADAPTER WITH ILLUMINATED ICON

CROSS-REFERENCE TO RELATED APPLICATION

This non-provisional application claims priority under 35 U.S.C. § 119(a) to patent application No. 112137191 filed in Taiwan, R.O.C. on Sep. 27, 2023, the entire contents of which are hereby incorporated by reference.

BACKGROUND

Technical Field

The present disclosure provides an adapter, and in particular, to an adapter with an illuminated icon.

Related Art

A housing of a conventional adapter is printed with identification or a label having a specification, a model, or another product information. In addition, another signal light may be arranged. The signal light emits light when the adapter operates to supply an external alternating current (AC) power supply to an electronic device after transformation and isolation, so as to remind a user of an operation status of the adapter. For example, a red light represents an operating failure or warning of the adapter, and a green light represents that the adapter normally operates.

SUMMARY

Some embodiments of the present invention provide an adapter with an illuminated icon. The adapter includes an enclosure, a circuit module, a shielding element, a control module, a backlight module, and a masking element. The enclosure has an accommodating slot, and a side surface of the enclosure has a transparent area. The circuit module is arranged in the accommodating slot. The shielding element covers an outer side of the circuit module. The control module is arranged in the accommodating slot and connected to the circuit module. The control module receives power from the circuit module. The backlight module is located on an outer side of the shielding element and connected to the control module. The control module provides power to the backlight module. The backlight module includes a light-emitting area. The light-emitting area corresponds to the transparent area. The masking element corresponds to the transparent area and the light-emitting area. At least part of the masking element is transparent. The control module controls the backlight module to cause the light-emitting area to emit a plurality of light to irradiate the masking element, and part of the light extends through the masking element and penetrates the enclosure through the transparent area.

In an embodiment, the backlight module further includes a circuit board, a light-emitting element, a reflective layer, a light guide plate, and a diffuser. The circuit board, the reflective layer, the light guide plate, and the diffuser are arranged in sequence. The light-emitting element is located between the circuit board and the diffuser and is adjacent to the reflective layer and the light guide plate.

In an embodiment, the backlight module further includes a light shielding member covering a periphery of the backlight module.

In an embodiment, the backlight module further includes a peep-proof protection member. The peep-proof protection member is arranged on an outer side of the transparent area.

In an embodiment, the transparent area has a transparent window and includes a transparent plate, and the transparent plate is fixed to the transparent window.

In an embodiment, the transparent plate is fixed to the transparent window through insert molding, and the side surface of the enclosure and a surface of the transparent plate are flush and engaged with each other.

In an embodiment, the side surface of the enclosure has an upper wall and a lower wall, and the upper wall and the lower wall are respectively wrapped around side edges of the transparent plate, so that the transparent plate is fixed to the enclosure.

In an embodiment, the side surface of the enclosure and the transparent area are integrally formed.

In an embodiment, the control module receives power from a primary side of the circuit module.

In an embodiment, the control module receives power from a secondary side of the circuit module.

In an embodiment, the control module has a ground, and the ground is located on the outer side of the shielding element and close to a cable.

In an embodiment, the control module has a power board, and the power board is connected to the circuit module and the backlight module.

In an embodiment, the control module further includes a processor and a light emission driver, and the processor and the light emission driver are located between the power board and a wiring terminal.

In an embodiment, the control module further includes a wireless communication element, and the wireless communication element is connected to the light emission driver and the backlight module.

In an embodiment, the control module correspondingly controls the light of the backlight module based on a light effect parameter to control display of the illuminated icon.

In an embodiment, a separator is further included. The separator is located in the accommodating slot to separate the circuit module and the backlight module.

In an embodiment, a thermally conductive member is included. Two sides of the thermally conductive member are respectively attached to the backlight module and the separator.

DETAILED DESCRIPTION

Figure 1:
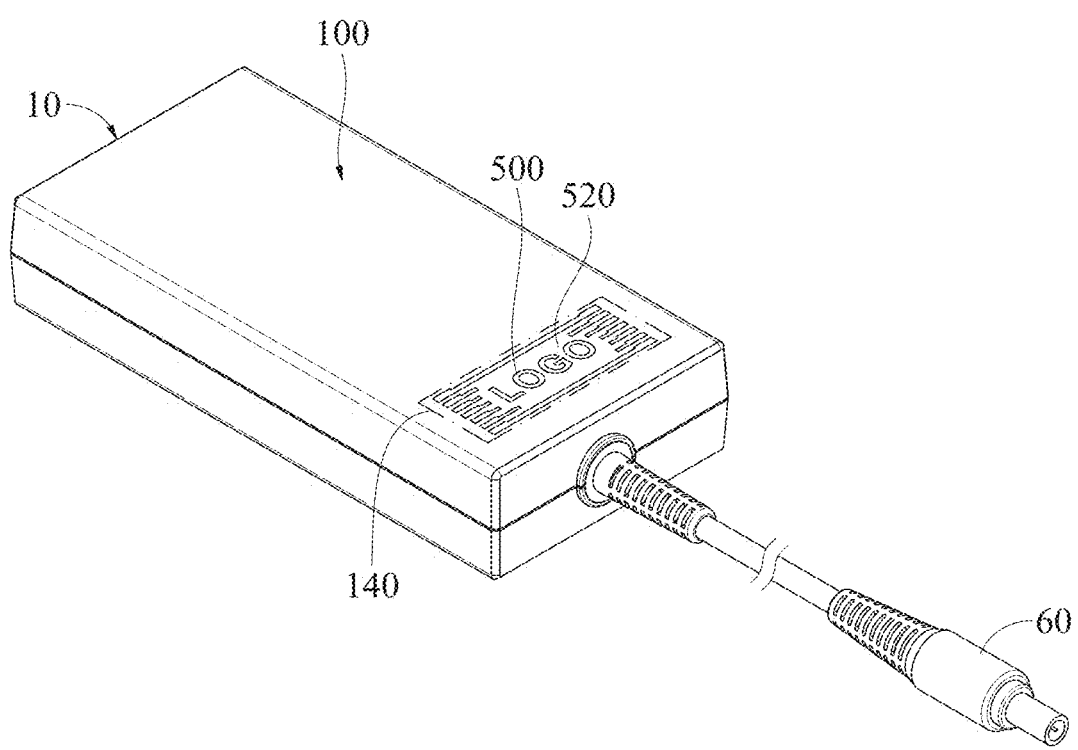
FIG. 1 is a three-dimensional schematic diagram of an adapter with an illuminated icon according to some embodiments.
Figure 2:
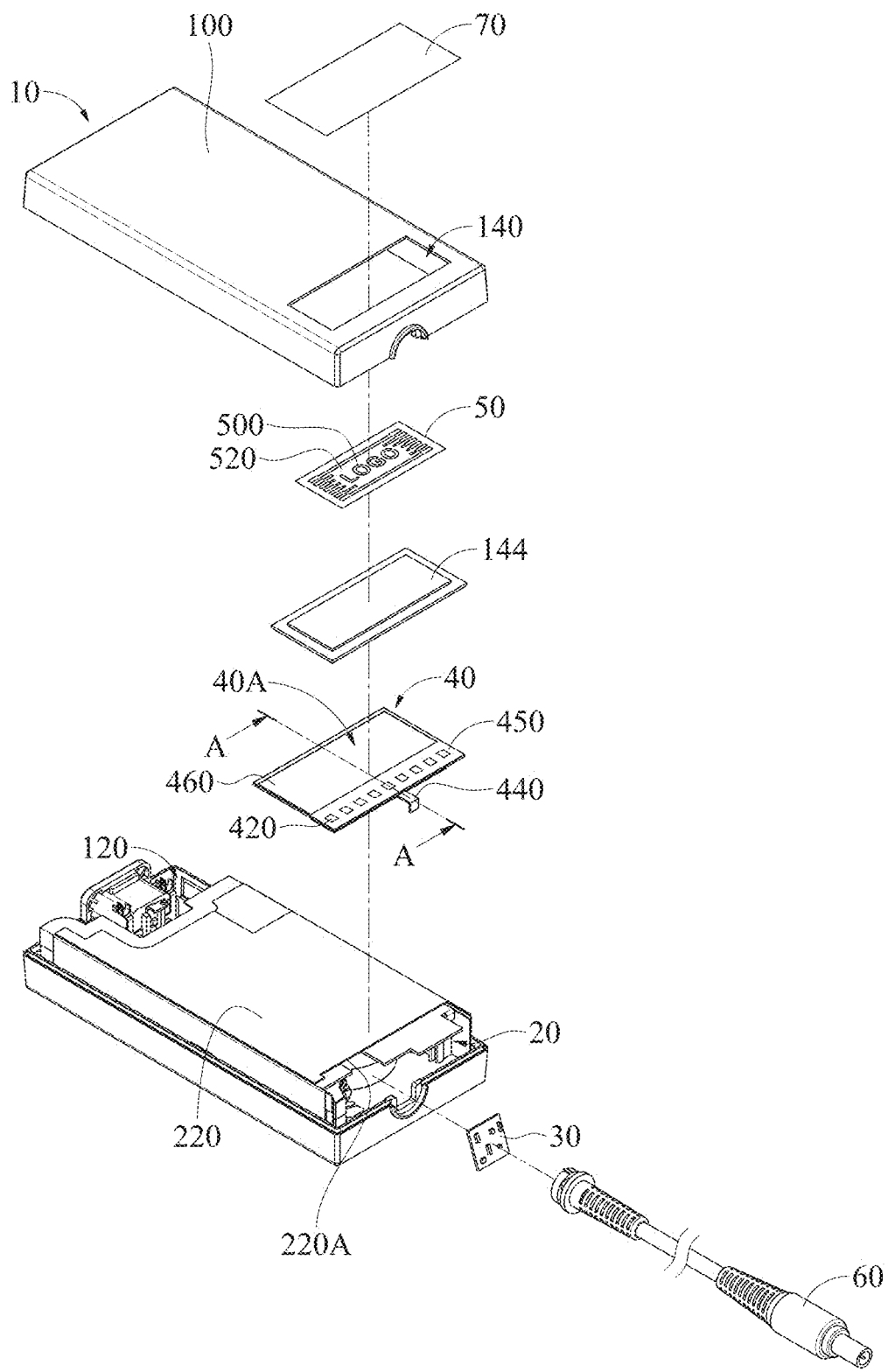
FIG. 2 is an exploded schematic diagram of an adapter with an illuminated icon according to some embodiments.

Referring to FIG. 1 and FIG. 2, FIG. 1 is a three-dimensional schematic diagram of an adapter with an illuminated icon according to some embodiments, and FIG. 2 is an exploded schematic diagram of an adapter with an illuminated icon according to some embodiments. In an implementation, the adapter with an illuminated icon includes an enclosure 10, a circuit module 20, a shielding element 220, a control module 30, a backlight module 40, and a masking element 50. The enclosure 10 has an accommodating slot 120 inside, and the circuit module 20 and the shielding element 220 are accommodated in the accommodating slot 120.

A side surface 100 of the enclosure 10 has a transparent area 140. The transparent area 140 is provided mainly to enable light emitted by the backlight module 40 to penetrate outside the enclosure 10, so that a user can see the light emitted by the backlight module 40. In some embodiments, one or more transparent areas 140 may be provided and may be arranged at any position only on one side surface 100 or on different side surfaces 100 of the enclosure 10. The transparent area 140 may be formed in many manners, including but not limited to hollowing out the enclosure 10 at a specific area to form the transparent area in one step; hollowing out the enclosure 10 at a specific area and then attaching a transparent plate 144 through snapping, sticking, inlaying, or the like; inlaying the transparent plate 144 in the enclosure 10 through injection overmolding; integrally injection molding the enclosure 10 and the transparent area 140 by using an opaque plastic and a transparent plastic through co-injection molding in one step; or integrally injection molding a corresponding side surface 100 of the enclosure 10 and the transparent area 140 by using a transparent plastic.

The shielding element 220 is covered a periphery of an outer side of the circuit module 20 and jointly accommodated in the accommodating slot 120. In some embodiments, an outer layer of the shielding element 220 is a metal layer, which can isolate external electromagnetic waves and prevent an electronic component of the circuit module 20 from being disturbed or damaged by the electromagnetic waves. An inner side of the shielding element 220 has an insulating layer made of an insulating material such as polyester film (Mylar). A main board or the electronic component on the circuit module 20 may be avoided from directly contacting a metal layer of the shielding element 220 to cause a short circuit or failure.

The control module 30 is arranged in the accommodating slot 120 and connected to the circuit module 20. The control module 30 receives power from the circuit module 20. In some embodiments, the control module 30 may be arranged on an inner side the shielding element 220 or an outer side of the shielding element 220. The arrangement position may be adjusted or changed based on an actual request, but is not limited thereto. In some embodiments, the backlight module 40 is located on an outer side the shielding element 220 and is connected to the control module 30. The control module 30 provides power and control instructions to the backlight module 40, so that the backlight module 40 emits light based on a specific mode.

The backlight module 40 includes a light-emitting area 40A, and a size and an arrangement position of the light-emitting area 40A correspond to the transparent area 140. In some embodiments, a circuit board 400 of the backlight module 40 (refer to FIG. 3) is connected to the control module 30 through a wiring terminal 440, and the control module 30 transmits the power received by the circuit module 20 to the backlight module 40 through the wiring terminal 440. In some embodiments, thickness of the backlight module 40 is thinned, and the total thickness may be between 2.5 mm and 3 mm, so that the backlight module 40 may be arranged in a small gap between the enclosure 10 and the shielding element 220. In addition, the backlight module 40 corresponds to a quantity, a size, and an arrangement position of the transparent area 140. The size of the backlight module 40 may be the same as the size of the transparent area 140 or slightly greater than the size of the transparent area 140.

The masking element 50 is arranged corresponding to the transparent area 140 and the light-emitting area 40A, and the size of the masking element 50 corresponds to the transparent area 140. In some embodiments, the masking element 50 has a transparent portion 500 and an opaque portion 520. The opaque portion 520 may be made of an opaque material, and the transparent portion 500 may be made of a material that is completely transparent or semi-transparent (a light transmittance is not zero). In some implementations, the masking element 50 may be a thin sheet-like element that exists alone and may be arranged between the light-emitting area 40A and the transparent area 140, or may be arranged on a side of the transparent area 140 away from the light-emitting area 40A, or may be embedded in the transparent area 140 or the backlight module 40. In some other embodiments, the masking element 50 is a printed layer that is printed and attached to a surface of the backlight module 40 or the transparent area 140. The control module 30 controls the backlight module 40 to cause the light-emitting area 40A to emit light to irradiate the masking element 50, so that part of the light penetrates the enclosure 10 through the transparent area 140 and forms an illuminated icon PIC. In other words, the light emitted by the light-emitting area 40A is irradiated to the transparent portion 500 and the opaque portion 520 of the masking element 50. The light irradiated to the transparent portion 500 penetrates the enclosure 10 through the transparent area 140 to form a light-emitting portion, the light irradiated to the opaque portion 520 is blocked to form a shadow portion, and the light-emitting portion and the shadow portion jointly form an illuminated icon PIC.

In some embodiments, when the circuit module 20 is covered by the shielding element 220, the shielding element 220 has an opening 220A for a cable 60 and/or a wiring terminal 440 to be threaded to the circuit module 20. For example, a gap of a metal shielding element 220 having a gap or a hole of a grid-like shielding element 220 may be used as an opening 220A. In addition to the shielding element 220 having a gap or a hole, an opening 220A may also be provided on the shielding element 220 for the cable 60 and/or the wiring terminal 440 to extend through.

In another embodiment, the shielding element 220 has openings 220A on a front side and/or a rear side. In other words, when the shielding element 220 covers only upper, lower, left, and right sides of the circuit module 20, and the front and rear sides of the circuit module 20 are not covered by the shielding element 220, an uncovered area on the front and/or rear sides is configured as the opening 220A. When the control module 30 is on an inner side the shielding element 220, the wiring terminal 440 of the backlight module 40 wounds along the outer side of the shielding element 220 to the opening 220A on the front side or the rear side of the shielding element 220 to extend into the shielding element 220 and be connected to the control module 30. In some embodiments, if the control module 30 is on an outer side of the shielding element 220, the backlight module 40 is connected to the control module 30 on the outer side of the shielding element 220. Thereby, regardless of whether the control module 30 is arranged on the inner side or the outer side the shielding element 220, the shielding element 220 does not need to be additionally provided with a hole for wiring, so as to maintain a good shielding effect.

Figure 3:
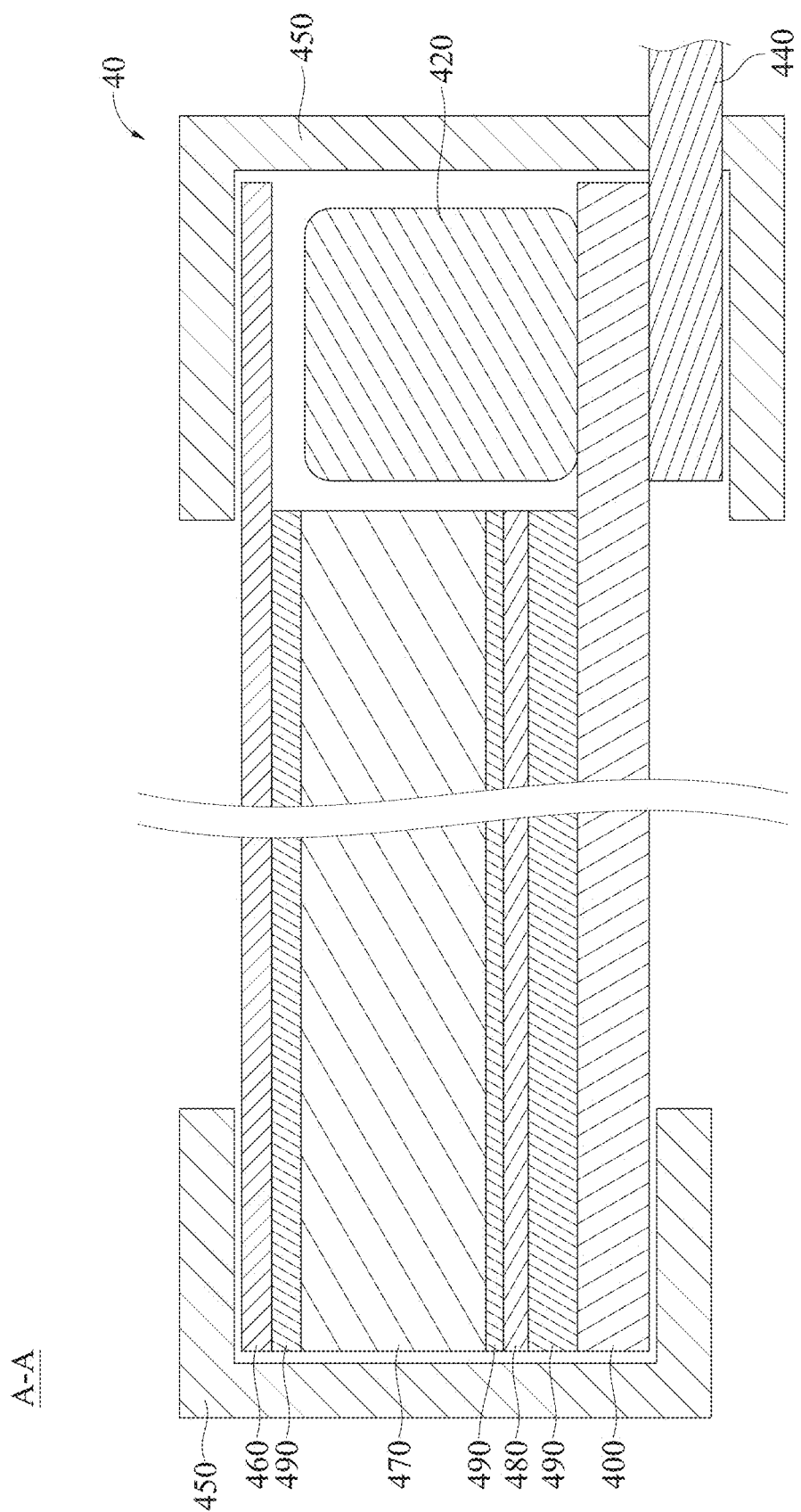
FIG. 3 is a schematic diagram illustrating a cross section taken along a line A-A of FIG. 2.

Referring to FIG. 2 and FIG. 3, FIG. 3 is a schematic diagram illustrating a cross section taken along a line A-A of FIG. 2., which is a schematic diagram of a stacked structure of the backlight module. In some embodiments, the backlight module 40 further includes a circuit board 400, a light-emitting element 420, a reflective layer 480, a light guide plate 470, and a diffuser 460. The circuit board 400, the reflective layer 480, the light guide plate 470, and the diffuser 460 are arranged in sequence. The light-emitting element 420 is located between the circuit board 400 and the diffuser 460 and is adjacent to the reflective layer 480 and the light guide plate 470.

Referring to FIG. 3, in some embodiments, the masking element 50 may be implemented by printing ink onto the diffuser 460. The light emitted by the light-emitting element 420 is transmitted by the light guide plate 470, reflected by the reflective layer 480, and diffused by the diffuser 460, so that the backlight module 40 may provide uniform illumination. While a light-shielding black paint or a transparent paint printing pattern may be used on a surface of the diffuser 460. The light-shielding black paint may block penetration of the light from the light-emitting element 420, and the light penetrates the parts that is painted or not painted. In other words, the light of the light-emitting element 420 is partially blocked by the shading black paint on the diffuser 460, and part of the light is not blocked by the shading black paint, thereby forming the illuminated icon PIC. That is to say, the light-emitting area 40A of the backlight module 40 emits light to irradiate the masking element 50, so that part of the light penetrates the enclosure 10 through the transparent area 140 and forms the illuminated icon PIC.

The circuit board 400, the reflective layer 480, the light guide plate 470 and the diffuser 460 may be bonded to each other by an adhesive 490. The adhesive 490 may resist an adverse effect on the backlight module 40 caused by a factor such as vibration and thermal expansion.

In some embodiments, a periphery of the backlight module 40 has a covered light shielding member 450. The light shielding member 450 may block the light of the light-emitting element 420 from overflowing from the side surface of the backlight module 40, and may control scattering of light to avoid light scattering and a shadow effect, thereby increasing an overall display effect of the backlight module 40. In addition, the light shielding member 450 may also prevent a light source or a stray light in an external environment from entering the backlight module 40 and affect a display quality of the backlight module 40.

In addition, since the backlight module 40 is located outside the shielding element 220, the light shielding member 450 is located between the shielding element 220 and the backlight module 40 to achieve an insulative protection and prevent an electrical contact between the shielding element 220 and the backlight module 40, thereby avoiding a possible short circuit and electrical interference, and simultaneously preventing an external object, a dust, a moisture, and the like from entering the backlight module 40 to reduce a risk of damage. The light shielding member 450 may be, but is not limited to, a polyester film (Mylar).

Still referring to FIG. 2, in some embodiments, the transparent area 140 may be covered with a layer of a peep-proof protection member 70, and a size of the peep-proof protection member 70 corresponds to a size of the transparent area 140. The peep-proof protection member 70 may be realized in a form of a privacy protection plate or a privacy protection film. The privacy protection plate is directly bonded to the transparent area 140, and the privacy protection film is attached to a side of the transparent plate 144 when the transparent plate 144 is provided. The peep-proof protection member 70 has a viewing angle defining function, which restricts a visible range when the user views the light that penetrates the transparent area 140, and only allows the user to visually see the transmitted light and the illuminated icon PIC within a predetermined range angle.

Figure 4:
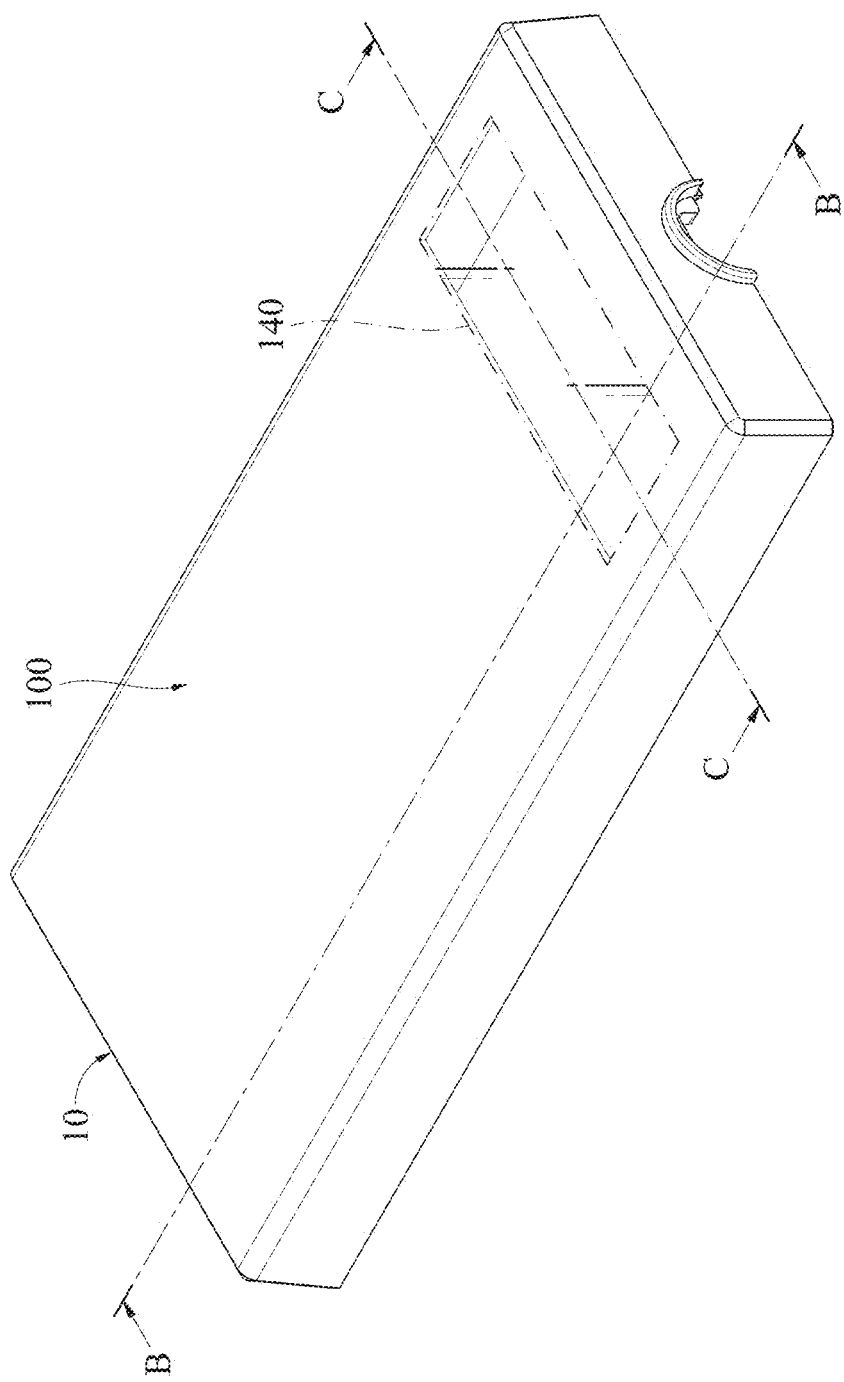
FIG. 4 is a three-dimensional schematic diagram of an enclosure according to some embodiments.
Figure 5A:
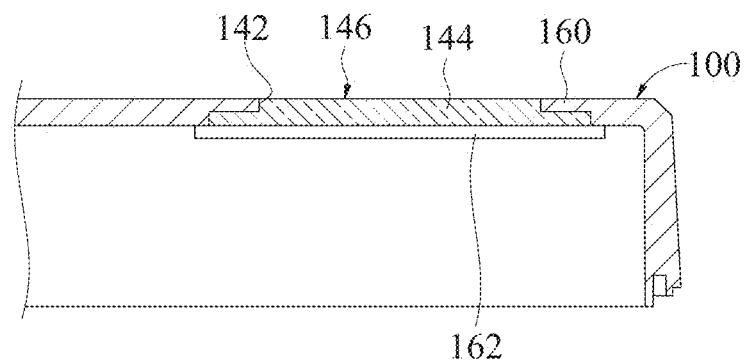
FIG. 5A is a schematic diagram illustrating a cross section taken along a line B-B of FIG. 4.
Figure 5B:
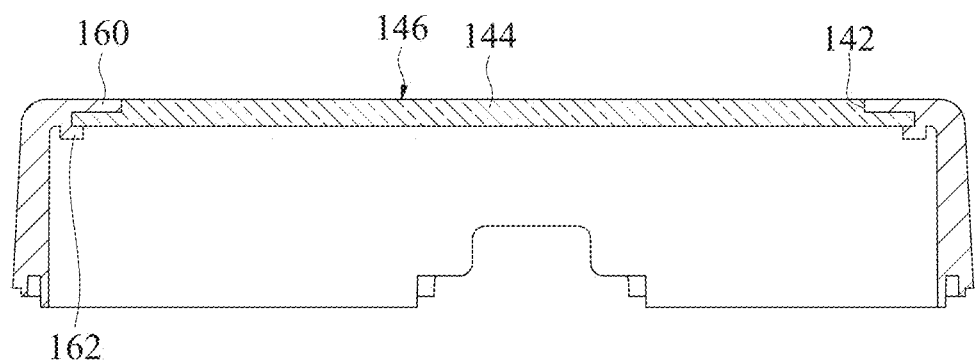
FIG. 5B is a schematic diagram illustrating a cross section taken along a line C-C of FIG. 4.

Referring to FIG. 4, FIG. 5A, and FIG. 5B, FIG. 4 is a three-dimensional schematic diagram of an enclosure according to some embodiments. FIG. 5A is a schematic diagram illustrating a cross section taken along a line B-B of FIG. 4. FIG. 5B is a schematic diagram illustrating a cross section taken along a line C-C of FIG. 4. In some embodiments, the transparent area 140 has a transparent window 142. The transparent window 142 may have the same size as a side surface 100 or only a part of the side surface 100. The transparent area 140 includes a transparent plate 144. The transparent plate 144 is fixed to the transparent window 142.

Figure 6A:
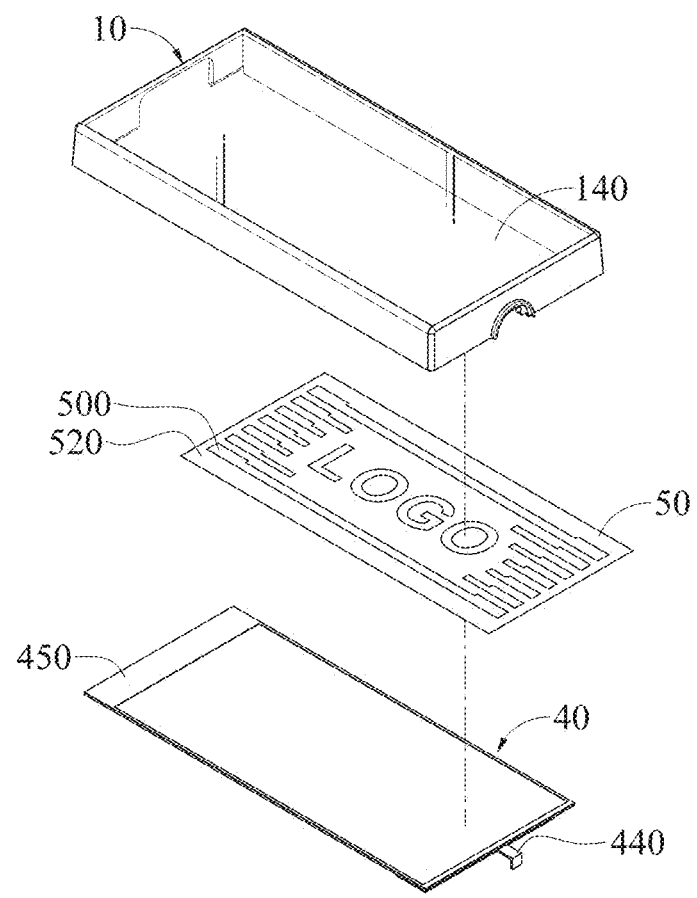
FIG. 6A is an exploded schematic diagram of an adapter with an illuminated icon according to some embodiments.
Figure 6B:
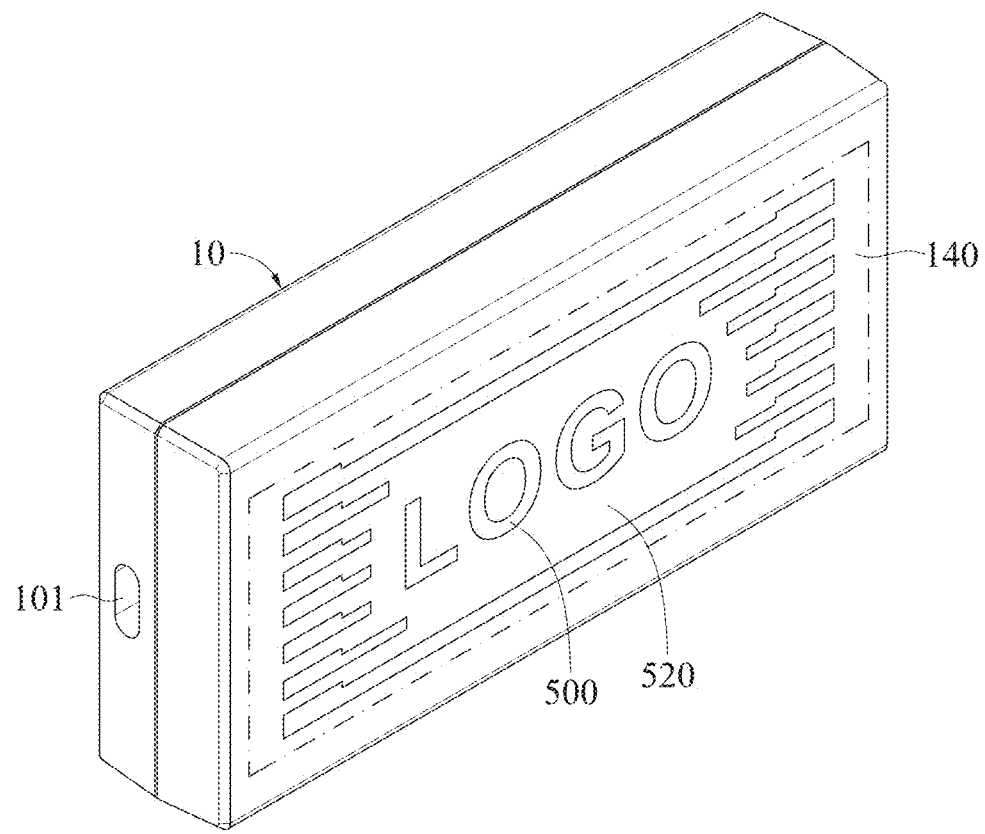
FIG. 6B is a schematic diagram of an adapter with an illuminated icon of FIG. 6A according to some embodiments.

Referring to FIG. 2, FIG. 4, FIG. 5A, and FIG. 5B, a size of the transparent plate 144 substantially corresponds to a size of the transparent area 140, and the transparent plate 144 is substantially fixed to the transparent area 140. In some embodiments, the transparent plate 144 is fixed to the transparent window 142 through insert molding. The transparent plate 144 and the enclosure 10 may be made of different materials, and the entire transparent plate 144 is embedded in the enclosure 10 during injection molding of the enclosure 10. In this way, when the enclosure 10 is formed, the transparent plate 144 is substantially fixed to the side surface 100 of the enclosure 10. In some embodiments, the entire side surface 100 of the enclosure 10 may be provided with the transparent plate 144, or the entire side surface 100 of the enclosure 10 may be directly injection-molded with a material that is partially transparent or has a specific light transmittance (as shown in FIG. 6A and FIG. 6B). Details are described later.

Figure 5C:
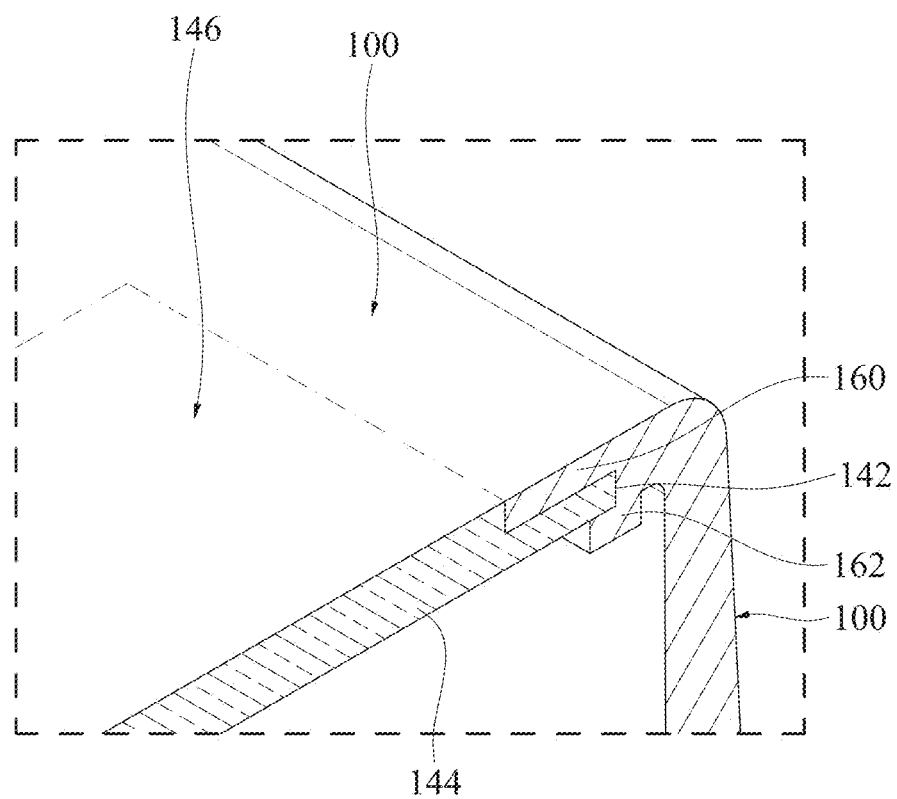
FIG. 5C is a schematic partial three-dimensional cross-sectional view of FIG. 4.

Referring to FIG. 4, FIG. 5A, and FIG. 5B, the side surface 100 of the enclosure 10 and an upper surface 146 of the transparent plate 144 are flush and engaged with each other. That is to say, a gap is not defined where the side surface 100 contacts the transparent plate 144 (as shown in FIG. 5C, the imaginary one-point chain line does not exist when an actual product appearance is viewed). Therefore, external static electricity may be prevented from flowing into the enclosure 10 from the transparent area 140, and the circuit module 20, the control module 30, and the backlight module 40 located in the accommodating slot 120 may be further protected. Besides, structural strength between the enclosure 10 and the transparent plate 144 may also be enhanced through insert molding.

Referring to FIG. 4, FIG. 5A, FIG. 5B, and FIG. 5C, in some embodiments, the enclosure 10 has an upper wall 160 and a lower wall 162. When the transparent plate 144 is bonded to the transparent area 140, the upper wall 160 and the lower wall 162 are respectively wrapped around side edges of the transparent plate 144, and the transparent plate 144 is substantially fixed to the side surface 100.

Referring to FIG. 6A and FIG. 6B, FIG. 6A is an exploded schematic diagram of an adapter with an illuminated icon according to some embodiments. FIG. 6B is a schematic diagram of an adapter with an illuminated icon FIG. 6A according to some embodiments. If the transparent plate 144 is made of a different material than the enclosure 10, a shape of the transparent plate 144 is seen on the enclosure 10 to affect the appearance of the product. To solve the above problems and make the product more beautiful, the entire enclosure 10 may be directly injection-molded with a material that is partially transparent or has a specific light transmittance. For example, the size of the transparent area 140 is the same as that of the entire side surface 100, and the side surface 100 is injection-molded with a material that is partially transparent or has a specific light transmittance, so as to improve texture of the appearance of the product.

In some embodiments, the transparent plate 144 is made of a material that may be penetrated by light, and the light transmittance may be between 4% and 20%. As shown in FIG. 1, when the transparent plate 144 is applied to a local position of the side surface 100, the light transmittance of the transparent plate 144 may be 5% to 8%. As shown in FIG. 10B, when the transparent plate 144 is applied to an entire area of the side surface 100 (or the side surface 100 of a longer size), the light transmittance of the transparent plate 144 may be 15% to 20%.

Figure 7A:
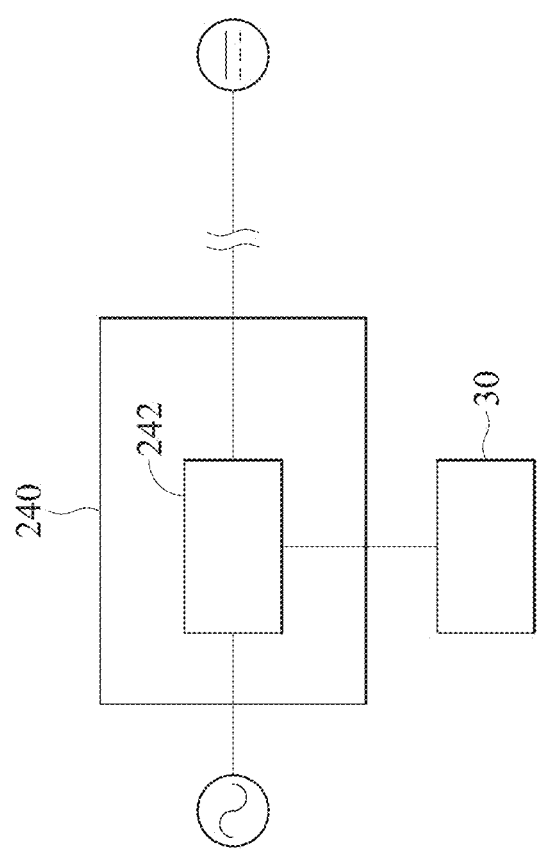
FIG. 7A is a functional block diagram of an example in which a control module obtains power from a circuit module.

Referring to FIG. 2 and FIG. 7A, FIG. 7A is a functional block diagram of an example in which a control module 30 obtains power from a circuit module 20. In some embodiments, a wiring terminal 440 of the backlight module 40 is powered by a primary side 240 of the circuit module 20 through the control module 30. When the circuit module 20 inputs and converts power, power may be supplied to a controller 242, so that the controller 242 may adjust an output power supply. The controller 242 of circuit module 20 and control module 30 may be connected at a position of the primary side 240 by adding a winding, so that the control module 30 may obtain the power at the controller 242, and the control module 30 may obtain power from the primary side 240. The power obtained by the control module 30 from the primary side 240 is transmitted to the backlight module 40 through the wiring terminal 440.

Figure 7B:
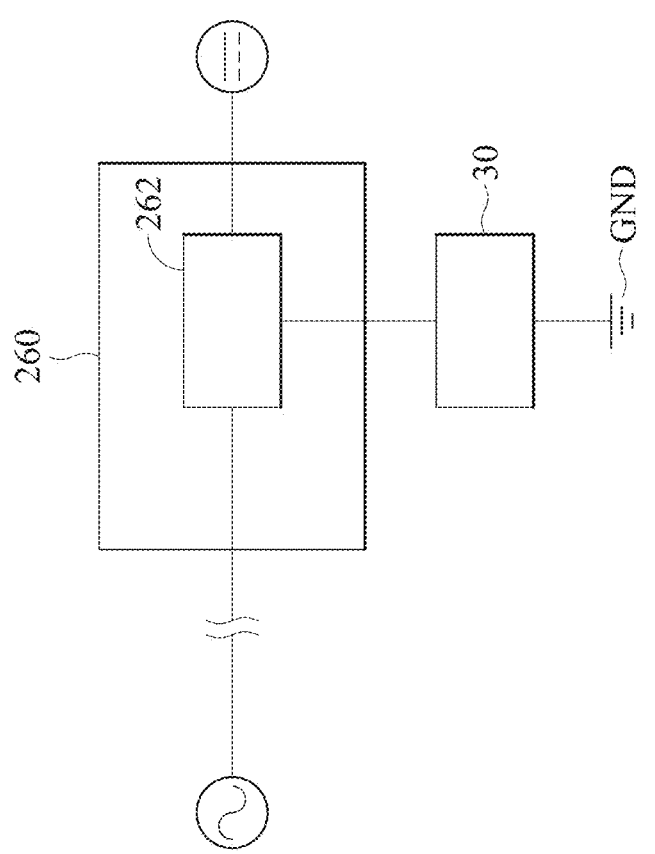
FIG. 7B is a functional block diagram of another example in which a control module obtains power from a circuit module.

Referring to FIG. 2 and FIG. 7B, FIG. 7B is a functional block diagram of another example in which a control module 30 obtains power from a circuit module 20. In some embodiments, a wiring terminal 440 of the backlight module 40 is powered by a secondary side 260 of the circuit module 20 through the control module 30. Before the power is outputted to the electronic device, a direct current (DC) output power supply to be outputted may be smoothed through an output capacitor 262 to reduce a pulse noise or fluctuation of the DC output power supply. In this case, the control module 30 is connected to the output capacitor 262, so that the control module 30 may obtain the power at the output capacitor 262, so that the control module 30 may obtain power from the secondary side 260. The power obtained by the control module 30 from the secondary side 260 is transmitted to the backlight module 40 through the wiring terminal 440.

Referring to FIG. 7A and FIG. 7B, in some embodiments, the primary side 240 and the secondary side 260 may further include a filter, a rectifier bridge, a voltage smoothing device, a secondary rectifier, a voltage regulator, a feedback circuit, a switching element, and the like for converting AC power into DC power. In some embodiments, the backlight module 40 is powered by the primary side 240 or powered by the secondary side 260. A wiring manner of the power taking is connected to the circuit module 20 of the adapter by winding traces at both ends. That is, a structure of the shielding element 220 is not be damaged, and there is no need to dig an additional hole for wiring.

Figure 8:
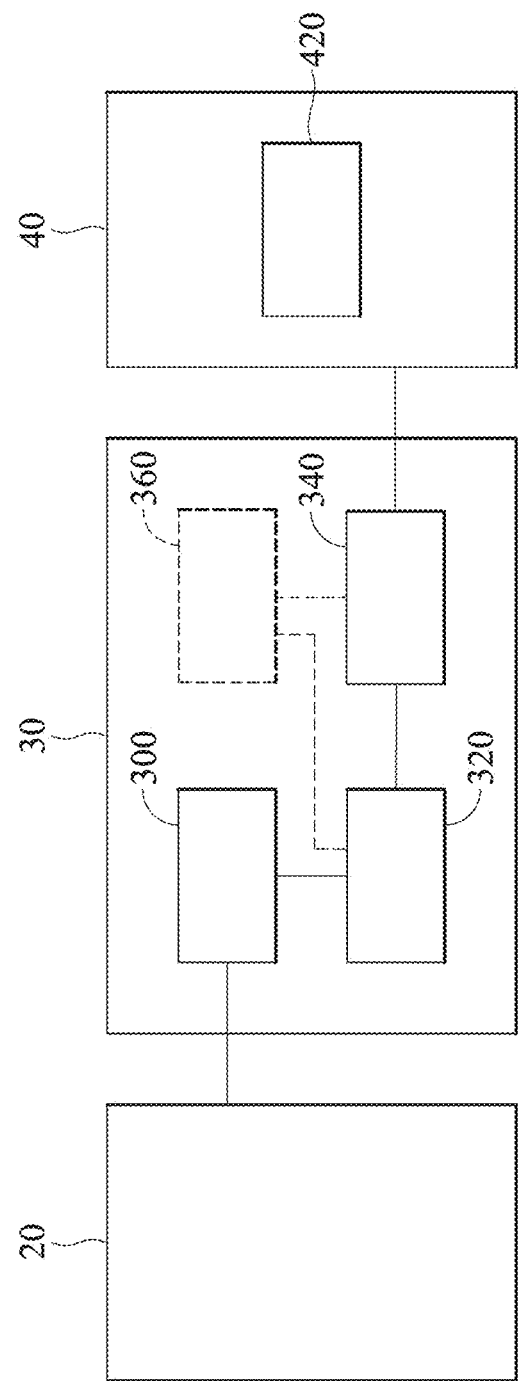
FIG. 8 is a functional block diagram of a circuit module, a control module, and a backlight module according to some embodiments.

Referring to FIG. 2, FIG. 3, and FIG. 8, FIG. 8 is a functional block diagram of a circuit module, a control module, and a backlight module according to some embodiments. In some embodiments, the control module 30 includes a power board 300, a processor 320, a light emission driver 340, and a communication element 360. The power board 300 is connected to the circuit module 20, and the power board 300 is configured to obtain power from the circuit module 20. The processor 320 and the light emission driver 340 are located between the power board 300 and the wiring terminal 440, and power is transmitted from the power board 300 to the wiring terminal 440 through the processor 320 and the light emission driver 340. After the processor 320 is powered on, the processor 320 transmits a control signal that enables the light-emitting element 420 to emit light based on the light effect parameter to the light emission driver 340. The light emission driver 340 adjusts the voltage input to the light-emitting element 420 based on the control signal to control light-emitting time and brightness of the light-emitting element 420.

In some embodiments, a manner of the light-emitting element 420 emitting light is written into the processor 320 in a form of an instruction, for example, firmware of the processor 320 is written. The processor 320 performs an operation based on the instructions in the firmware to generate a control signal, outputs the control signal to the light emission driver 340, and controls the light emission driver 340 to output a voltage and a current corresponding to the light-emitting mode to the backlight module 40.

The communication element 360 may receive the control signal in a wired manner or a wireless manner, so that the backlight module 40 presents the illuminated icon PIC with different light effect parameters. The communication element 360 may be connected to the processor 320 to transmit the signal or the control signal of the device to the processor

320. After processing the control signal, the processor 320 transmits the control signal to the light emission driver 340, and drives the backlight module 40 to emit light. The communication element 360 may also be directly connected to the light emission driver 340, and receives the control signal that may directly control light emission of the backlight module 40 through the communication element 360 to control parameters such as a brightness and a color of the backlight module 40.

In some embodiments, the control module 30 is independently arranged outside the circuit module 20 and the backlight module 40, and may also be arranged on the circuit board 400 of the circuit module 20 or the main board of the backlight module 40. If the control module 30 is independently arranged, and the position where the control module 30 is located may be affected by static electricity from external intrusion due to proximity to a cable 60, the control module 30 needs to be provided with a ground GND (as shown in FIG. 6B) to avoid a failure of the control processor 320 due to a problem of static electricity generated by the proximity of the control module 30 to the cable 60. If the control module 30 is arranged on the backlight module 40, the power board 300 of the control module 30 is located outside the shielding element 220, and the power board 300 and the circuit module 20 may be connected by the opening 220A of the shielding element 220. If the control module 30 is arranged on the circuit board 400 and the power board 300 is located inside the shielding element 220, the wiring terminal 440 of the backlight module 40 extends toward the opening 220A of the shielding element 220 to enter an interior of the shielding element 220 for connection with the control module 30. A height of the control module 30 may depend on a different adapter model, such as but not limited to 1.75 mm.

Figure 9A:
FIG. 9A is a schematic diagram of a layer-by-layer change of light emitted from an icon according to some embodiments, where a marquee state is displayed on a leftmost side of a plurality of horizontal stripes and a LOGO icon.
Figure 9B:
FIG. 9B is a schematic diagram of a layer-by-layer change of light emitted from an icon according to some embodiments, where a marquee state is displayed on a middle side of a plurality of horizontal stripes and a LOGO icon.
Figure 9C:
FIG. 9C is a schematic diagram of a layer-by-layer change of light emitted from an icon according to some embodiments, where a marquee state is displayed on a rightmost side of a plurality of horizontal stripes and a LOGO icon.

Referring to FIG. 9A to FIG. 9C, FIG. 9A to FIG. 9C are schematic diagrams of a layer-by-layer change of light emitted from an icon. FIG. 9A displays a marquee state on a leftmost side of a plurality of horizontal stripes and a LOGO icon. FIG. 9B displays a marquee state on a middle side of a plurality of horizontal stripes and a LOGO icon. FIG. 9C displays a marquee state on a rightmost side of a plurality of horizontal stripes and a LOGO icon. In some embodiments, the illuminated icon PIC is a text, a texture, a graphic, or a combination thereof based on a usage requirement. For example, the illuminated icon PIC may be a shape of a LOGO, a cone, a square, a triangle, a trapezoid, a stripe, or a combination thereof, and the illuminated icon PIC is also an irregular shape of a point, line, plane, or a combination thereof. Referring to FIG. 2, in some embodiments, the light generated by the backlight module 40 may penetrate the transparent portion 500 of the masking element 50 and be blocked by the opaque portion 520, and the light penetrating from the transparent portion 500 and the shadow of the opaque portion 520 together form the illuminated icon PIC on the adapter. The transparent portion 500 and the opaque portion 520 have different light transmittances. On the illuminated icon PIC, the light-emitting area corresponds to the transparent portion 500 of the masking element 50, and a covered area preventing the light generated by the backlight module 40 from penetration corresponds to the opaque portion 520 of the masking element 50.

In some embodiments, the control module 30 has a light effect parameter. The light effect parameter correspondingly controls a display manner of the illuminated icon PIC. That is, the light effect parameter may cause the illuminated icon PIC appear in a predetermined manner at a predetermined time and position. For example, the light generated by the backlight module 40 is a dynamic (or a static) gradient luminous change, such as a marquee-type gradient visual effect (also a breathing light-type gradient visual effect). Further, the light generated by the backlight module 40 is a grayscale color gradation visual effect, or a gradation visual effect of red, orange, yellow, green, blue, indigo, purple, or a combination thereof. The illuminated icon PIC may display a use status or a bright effect of the adapter, resulting in a dazzling effect. In some embodiments, when the backlight module 40 does not emit light, the adapter does not display the illuminated icon PIC to display the appearance color of the enclosure 10.

The light effect parameter may be pre-built in the control module 30, or may be transmitted to the control module 30 by the circuit module 20 or an external device (an electronic device, an external load, a remote control, or the like). The light effect parameter may be transmitted in a wired manner or a wireless manner.

In an embodiment that the processor 320 receives a device signal from the electronic device, the electronic device may transmit the light effect parameter to the processor 320 based on the load state. The processor 320 generates a corresponding control signal based on a different load state, so that the light-emitting element 420 of the backlight module 40 emits light in a different manner. For example, when the electronic device has no load or has a low load, the processor 320 generates a control signal displayed as a light signal from a green breathing light to control the backlight module 40 to emit light. When the electronic device has a heavy load, the processor 320 generates a control signal displayed as a light signal from a red breathing light to control the backlight module 40 to emit light.

Figure 10A:
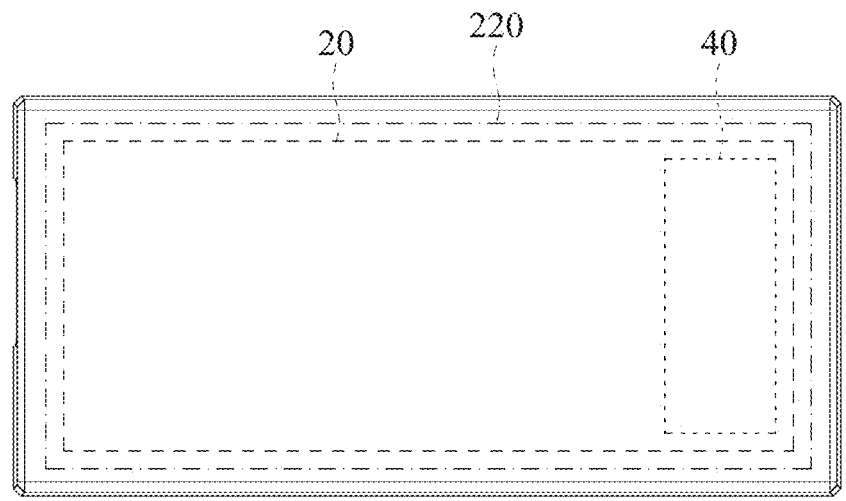
FIG. 10A is a schematic top view of an adapter according to some embodiments.
Figure 10B:
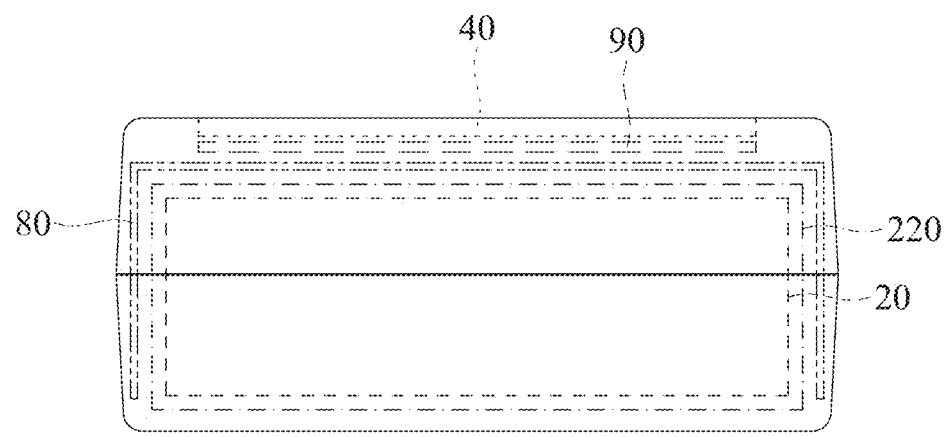
FIG. 10B is a schematic side view of an adapter according to some embodiments.

Referring to FIG. 10A and FIG. 10B, FIG. 10A is a schematic top view of an adapter according to some embodiments. FIG. 10B is a schematic side view of an adapter according to some embodiments. In some embodiments, the adapter includes a separator 80. The separator 80 is located in the accommodating slot 120 and separates the circuit module 20 and the backlight module 40. When the circuit module 20 generates a high temperature during operation, the separator 80 is configured to isolate a heat conduction between the circuit module 20 and the backlight module 40, thereby preventing the backlight module 40 from being affected by the high temperature generated by the circuit module 20, and helping to maintain stability of the backlight module 40 and prolong the life. A size and a shape of the separator 80 may be adapted to the backlight module 40 and the circuit module 20, and may be the same size as the backlight module 40 or slightly greater than the backlight module 40.

Referring to FIG. 10A and FIG. 10B, in some embodiments, when a material of the separator 80 is selected, a material with a good thermal insulation property, for example, an insulating material with a low thermal conductivity, requires be selected to ensure an effective thermal insulation. The separator 80 has an insulating protection function due to a selected material property, and electrical contact between the backlight module 40 and the circuit module 20 is prevented, thereby reducing a risk of a short circuit.

Referring to FIG. 10A and FIG. 10B, in some embodiments, a heat dissipation design of the circuit module 20 still requires to be considered in addition to mounting the separator 80. Even if the separator 80 may isolate part of the heat generated by the circuit module 20, there may still be some heat transfer to a contact surface of the separator 80 and the backlight module 40. In this case, the adapter further includes a thermally conductive member 90. Two sides of the thermally conductive member 90 are respectively attached to the backlight module 40 and the separator 80. The thermally conductive member 90 may further reduce the temperature to avoid heat accumulation on a surface of the separator 80.

Referring to FIG. 10A and FIG. 10B, in some embodiments, the thermally conductive member 90 is evenly placed between the backlight module 40 and the separator 80 and a gap is avoided to generate, to ensure that the thermally conductive member 90 has a good heat conduction effect and help to dissipate heat. The thermally conductive member 90 is a thermally conductive silicone sheet. If an uneven area exists between the backlight module 40 and the separator 80, it is filled with a thermally conductive silicone sheet to maximize a contact area between the thermally conductive member 90 and the separator 80, thereby improving the thermal conduction efficiency.

In some embodiments, the circuit module 20 receives power from an external power source and connects the electronic device through a cable 60 to transmit power to the electronic device. In some embodiments, the adapter may also not be provided with the cable 60. The adapter has a jack 101 (see FIG. 6B) that provides an electrical connection to an external cable. For example, the jack 101 is a specification of a connection interface of a USB TYPE-C.

Based on the above, according to some embodiments, a backlight module is added to the adapter including the circuit module, so that the adapter displays an icon and/or adapter information in a luminous manner, which has an aesthetic effect. According to some embodiments, the transparent plate and the enclosure are integrated through insert molding to enhance the structural strength of the transparent plate and prevent a static electricity from entering the enclosure from the gap between the transparent plate and the enclosure.

According to some embodiments, the thermally conductive member is respectively attached to the backlight module and the separator to reduce the temperature and avoid heat accumulation on the surface of the separator. According to some embodiments, the backlight module is configured to obtain power from the primary side or from the secondary side. The wiring method of obtaining power is wound from both ends to the main board of the adapter, and the structure of the shielding element is not being damaged. According to some embodiments, a light-emitting diode of the backlight module is configured to control a mode of light emission by the control circuit on the backlight module, or to change a mode of light emission by receiving a control instruction from a device terminal. In addition, the communication element may also be mounted to the backlight module to wirelessly transmit and receive data to change the light emission mode.

What is claimed is:

1. An adapter with an illuminated icon, comprising:
an enclosure, having an accommodating slot, wherein a side surface of the enclosure has a transparent area;
a circuit module, arranged in the accommodating slot;
a shielding element, covering an outer side of the circuit module;
a control module, arranged in the accommodating slot and connected to the circuit module, wherein the control module receives power from the circuit module;
a backlight module, located on an outer side of the shielding element and connected to the control module, wherein the control module provides power to the backlight module, the backlight module comprises a light-emitting area, and the light-emitting area corresponds to the transparent area; and
a masking element, corresponding to the transparent area and the light-emitting area, wherein at least part of the masking element is transparent;
wherein the control module controls the backlight module to cause the light-emitting area to emit a plurality of light to irradiate the masking element, and part of the light extends through the masking element and penetrates the enclosure through the transparent area.

2. The adapter with an illuminated icon according to claim 1, wherein the backlight module further comprises a circuit board, a light-emitting element, a reflective layer, a light guide plate, and a diffuser, the circuit board, the reflective layer, the light guide plate, and the diffuser are arranged in sequence, and the light-emitting element is located between the circuit board and the diffuser and is adjacent to the reflective layer and the light guide plate.

3. The adapter with an illuminated icon according to claim 2, wherein the backlight module further comprises a light shielding member covering a periphery of the backlight module.

4. The adapter with an illuminated icon according to claim 1, further comprising a peep-proof protection member, wherein the peep-proof protection member is arranged on an outer side of the transparent area.

5. The adapter with an illuminated icon according to claim 1, wherein the transparent area has a transparent window and comprises a transparent plate, and the transparent plate is fixed to the transparent window.

6. The adapter with an illuminated icon according to claim 5, wherein the transparent plate is fixed to the transparent window through insert molding, and the side surface of the enclosure and a surface of the transparent plate are flush and engaged with each other.

7. The adapter with an illuminated icon according to claim 5, wherein the side surface of the enclosure has an upper wall and a lower wall, and the upper wall and the lower wall are respectively wrapped around side edges of the transparent plate, so that the transparent plate is fixed to the enclosure.

8. The adapter with an illuminated icon according to claim 5, wherein the side surface of the enclosure and the transparent area are integrally formed.

9. The adapter with an illuminated icon according to claim 1, wherein the control module receives power from a primary side of the circuit module.

10. The adapter with an illuminated icon according to claim 1, wherein the control module receives power from a secondary side of the circuit module.

11. The adapter with an illuminated icon according to claim 10, wherein the control module has a ground, and the ground is located on the outer side of the shielding element and close to a cable.

12. The adapter with an illuminated icon according to claim 1, wherein the control module has a power board, and the power board is connected to the circuit module and the backlight module.

13. The adapter with an illuminated icon according to claim 12, wherein the control module further comprises a processor and a light emission driver, and the processor and the light emission driver are located between the power board and a wiring terminal.

14. The adapter with an illuminated icon according to claim 13, wherein the control module further comprises a wireless communication element, and the wireless communication element is connected to the light emission driver and the backlight module.

15. The adapter with an illuminated icon according to claim 1, wherein the control module correspondingly controls the light of the backlight module based on a light effect parameter to control display of the illuminated icon.

16. The adapter with an illuminated icon according to claim 1, further comprising a separator, wherein the separator is located in the accommodating slot to separate the circuit module and the backlight module.

17. The adapter with an illuminated icon according to claim 1, further comprising a thermally conductive member, wherein two sides of the thermally conductive member are respectively attached to the backlight module and the separator.

18. The adapter with an illuminated icon according to claim 1, wherein the transparent area has a transparent window and comprises a transparent plate, the transparent plate is fixed to the transparent window, the transparent plate is fixed to the transparent window through insert molding, and the side surface of the enclosure and a surface of the transparent plate are flush and engaged with each other; the side surface of the enclosure has an upper wall and a lower wall, and the upper wall and the lower wall are respectively wrapped around side edges of the transparent plate; the adapter further comprises a peep-proof protection member, and the peep-proof protection member is arranged on an outer side of the transparent area; the side surface of the enclosure and the transparent area are integrally formed; the control module receives power from a primary side or a secondary side of the circuit module; the control module comprises a ground, a power board, a processor, a light emission driver, and a wireless communication element, the ground is located on the outer side of the shielding element and close to a cable, the power board is connected to the circuit module and the backlight module, the processor and the light emission driver are located between the power board and a wiring terminal, and the wireless communication element is connected to the light emission driver and the backlight module; the control module correspondingly controls the light rays of the backlight module based on a light effect parameter to control display of the illuminated icon; the backlight module further comprises a circuit board, a light-emitting element, a reflective layer, a light guide plate, and a diffuser, the circuit board, the reflective layer, the light guide plate, and the diffuser are arranged in sequence, and the light-emitting element is located between the circuit board and the diffuser and is adjacent to the reflective layer and the light guide plate; the backlight module further comprises a light shielding member covering a periphery of the backlight module; and the adapter further comprises a separator and a thermally conductive member, the separator is located in the accommodating slot to separate the circuit module and the backlight module, and two sides of the thermally conductive member are respectively attached to the backlight module and the separator.

\* \* \* \* \*